US012609668B2

(12) United States Patent
Yoneda et al.

(10) Patent No.: US 12,609,668 B2
(45) Date of Patent: Apr. 21, 2026

(54) NOISE FILTER CIRCUIT

(71) Applicant: Mitsubishi Electric Corporation,
Tokyo (JP)

(72) Inventors: Satoshi Yoneda, Tokyo (JP); Akihito Kobayashi, Tokyo (JP); Kenji Hirose, Tokyo (JP); Kyota Otsuka, Tokyo (JP); Kaito Hagiwara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 126 days.

(21) Appl. No.: 18/778,297

(22) Filed: Jul. 19, 2024

(65) Prior Publication Data

US 2024/0372521 A1 Nov. 7, 2024

Related U.S. Application Data

(63) Continuation of application No. PCT/JP2022/015759, filed on Mar. 30, 2022.

(51) Int. Cl.
| | |
|---|---|
| *H03H 7/09* | (2006.01) |
| *H03H 7/01* | (2006.01) |
| *H05K 1/181* | (2026.01) |
| *H05K 1/189* | (2026.01) |

(52) U.S. Cl.
CPC ............ *H03H 7/09* (2013.01); *H03H 7/0115* (2013.01); *H03H 7/1725* (2013.01); *H05K 1/181* (2013.01); *H05K 1/189* (2013.01); *H05K 2201/10015* (2013.01); *H05K 2201/1006* (2013.01)

(58) Field of Classification Search
CPC .. H03H 7/0153; H03H 7/0115; H03H 7/0138; H03H 7/17; H03H 7/09; H03H 7/425; H03H 1/0007

USPC .......................................... 333/181, 185, 175
See application file for complete search history.

(56) References Cited

U.S. PATENT DOCUMENTS

| | | | |
|---|---|---|---|
| 2017/0373492 A1 | 12/2017 | Ueki | |
| 2019/0341902 A1 | 11/2019 | Yoneda et al. | |
| 2020/0195215 A1* | 6/2020 | Yoneda ................... | H05K 1/162 |
| 2021/0211113 A1* | 7/2021 | Yoneda ................... | H01F 17/00 |

FOREIGN PATENT DOCUMENTS

| | | |
|---|---|---|
| WO | WO 2017/159282 A1 | 9/2017 |
| WO | WO 2018/025342 A1 | 2/2018 |

OTHER PUBLICATIONS

The International Search Report (PCT/ISA/210) issued in PCT/JP2022/015759, mailed on May 24, 2022.

* cited by examiner

*Primary Examiner* — Stephen E. Jones
(74) *Attorney, Agent, or Firm* — Birch, Stewart, Kolasch & Birch, LLP

(57) ABSTRACT

In a noise filter circuit, a coupling loop part having a capacitor which is connected to both a positive electrode side input loop line and a negative electrode side output loop line is mounted on a dielectric substrate in a state where a positive electrode side input line and a positive electrode side input end part are connected, a positive electrode side output line and a positive electrode side output end part are connected, a negative electrode side input line and a negative electrode side input end part are connected, and a negative electrode side output line and a negative electrode side output end part are connected.

7 Claims, 12 Drawing Sheets

NOISE FILTER CIRCUIT

CROSS REFERENCE TO RELATED APPLICATIONS

This application is a Continuation of PCT International Application No. PCT/JP2022/015759, filed on Mar. 30, 2022, which is hereby expressly incorporated by reference into the present application.

TECHNICAL FIELD

The present disclosure relates to a noise filter circuit.

BACKGROUND ART

An equivalent series inductance (referred to as ESL hereinafter) refers to an inductance component which is present in a shunt path extending from a point of connection of a capacitor in a main line to a grounding point. In an equivalent circuit where this ESL is included, the capacitor stops functioning at a frequency higher than the self-resonant frequency determined by the capacitance of the capacitor and the ESL. The ESL becomes a factor which degrades the filter performance of the capacitor, as mentioned above.

For example, Patent Literature 1 describes a noise filter circuit having a structure of cancelling an ESL (referred to as ESL cancellation structure hereinafter). This noise filter circuit includes a positive electrode side input line, a positive electrode side output line, a negative electrode side input line, a negative electrode side output line, a positive electrode side input loop line, a negative electrode side input loop line, a positive electrode side output loop line, a negative electrode side output loop line, a capacitor, and a dielectric substrate. The positive electrode side input line, the negative electrode side input line, the positive electrode side output line, the negative electrode side output line, the positive electrode side input loop line, and the negative electrode side output loop line are formed on a front surface of the dielectric substrate, the positive electrode side input line and the positive electrode side input loop line are connected, and the negative electrode side input line and the negative electrode side input loop line are connected.

Further, a ground conductor having a missing part is disposed on the whole of a rear surface of the dielectric substrate, and the positive electrode side output loop line and the negative electrode side output loop line are independently formed in the missing part of the ground conductor. The positive electrode side input loop line, the positive electrode side output loop line, and the positive electrode side output line are electrically connected via through holes, and the negative electrode side input loop line, the negative electrode side output loop line, and the negative electrode side output line are electrically connected via through holes. The capacitor has a positive electrode terminal which is connected to the positive electrode side input loop line, and a negative electrode terminal which is connected to the negative electrode side input loop line.

In the noise filter circuit described in Patent Literature 1, the positive electrode side input loop line and the positive electrode side output loop line, and the negative electrode side input loop line and the negative electrode side output loop line make up two coupling loops. Each of the coupling loops has the same winding direction, and has the same size and the same relative positional relationship. As a result, the noise filter circuit can cancel the ESL in the path to which the above-mentioned capacitor is connected without degrading the degree of balance between the lines including the positive electrode side input line and the positive electrode side output line and the lines including the negative electrode side input line and the negative electrode side output line.

CITATION LIST

Patent Literature

Patent Literature 1: WO No. 2018/025342

SUMMARY OF INVENTION

Technical Problem

In the noise filter circuit described in Patent Literature 1, the whole circuit including the coupling loops is formed on the dielectric substrate. Therefore, because even in the case of changing only the coupling loops in the noise filter circuit, the change has an influence on the whole noise filter circuit formed on the dielectric substrate, it is finally necessary to change the design of the whole noise filter circuit.

The present disclosure is made to solve the above-mentioned problem, and it is therefore an object of the present disclosure to provide a noise filter circuit that makes it possible to change coupling loops without changing the design of the whole circuit.

Solution to Problem

A noise filter circuit according the present disclosure includes: a mount portion having: a first positive electrode side input line, one end thereof being connected to a positive electrode side input terminal; a first negative electrode side input line, one end thereof being connected to a negative electrode side input terminal; a first positive electrode side output line one end thereof being connected to a positive electrode side output terminal; and a first negative electrode side output line one end thereof being connected to a negative electrode side output terminal; and a coupling loop part having a second positive electrode side input line, a second negative electrode side input line, a second positive electrode side output line, a second negative electrode side output line, a positive electrode side input loop line, a positive electrode side output loop line, a negative electrode side input loop line, a negative electrode side output loop line, and a capacitive circuit part, wherein the second positive electrode side input line, the positive electrode side input loop line, the positive electrode side output loop line, and the second positive electrode side output line are connected in series between a positive electrode side input end part and a positive electrode side output end part in order of the second positive electrode side input line, the positive electrode side input loop line, the positive electrode side output loop line, and the second positive electrode side output line, the second negative electrode side input line, the negative electrode side input loop line, the negative electrode side output loop line, and the second negative electrode side output line are connected in series between a negative electrode side input end part and a negative electrode side output end part in order of the second negative electrode side input line, the negative electrode side input loop line, the negative electrode side output loop line, and the second negative electrode side output line, a positive electrode terminal of the capacitive circuit part is connected to the positive electrode side input loop line, and a negative electrode terminal of the capacitive circuit part is connected to the negative electrode side output loop line, the positive electrode side input loop line has a winding direction identical to that of the positive electrode side output loop line, the negative electrode side input loop line has a winding direction identical to that of the negative electrode side output loop line, a loop of the positive electrode side input loop line and a loop of the positive electrode side output loop line are identical in size to a loop of the negative electrode side input loop line and a loop of the negative electrode side output loop line, and a relative positional relationship between the positive electrode side input loop line and the positive electrode side output loop line is identical to a relative positional relationship between the negative electrode side input loop line and the negative electrode side output loop line, the mount portion includes a first dielectric substrate having a mounting surface on which the coupling loop part is mounted, the first positive electrode side input line, the first negative electrode side input line, the first positive electrode side output line, and the first negative electrode side output line are disposed on the mounting surface of the first dielectric substrate, the coupling loop part is mounted in the mount portion in a state where another end of the first positive electrode side input line is connected to the positive electrode side input end, another end of the first positive electrode side output line is connected to the positive electrode side output end, another end of the first negative electrode side input line is connected to the negative electrode side input end, and another end of the first negative electrode side output line is connected to the negative electrode side output end, the coupling loop part has a second dielectric substrate, the second positive electrode side input line, the second negative electrode side input line, the second positive electrode side output line, the second negative electrode side output line, the positive electrode side input loop line, and the negative electrode side output loop line are disposed on a front surface of the second dielectric substrate, the positive electrode side output loop line is disposed on a rear surface of the second dielectric substrate, one end thereof is connected to the positive electrode side input loop line through the second dielectric substrate, and another end thereof is connected to the second positive electrode side output line through the second dielectric substrate, the negative electrode side input loop line is disposed on the rear surface of the second dielectric substrate, one end thereof is connected to the negative electrode side output loop line through the second dielectric substrate, and another end thereof is connected to the second negative electrode side input line through the second dielectric substrate, and the capacitive circuit part is disposed on the front surface of the second dielectric substrate, the positive electrode terminal is connected to the positive electrode side input loop line, and the negative electrode terminal is connected to the negative electrode side output loop line.

Advantageous Effects of Invention

According to the present disclosure, the coupling loop part having the capacitive circuit part connected to both the positive electrode side input loop line and the negative electrode side output loop line is mounted in the mount portion in the state where the first positive electrode side input line and the positive electrode side input end are connected, the first positive electrode side output line and the positive electrode side output end are connected, the first negative electrode side input line and the negative electrode side input end are connected, and the first negative electrode side output line and the negative electrode side output end are connected. By changing the coupling loop part which is separate from the mount portion, the noise filter circuit according to the present disclosure makes it possible to change the coupling loops without changing the design of the whole circuit.

DESCRIPTION OF EMBODIMENTS

Embodiment 1

Figure 1:
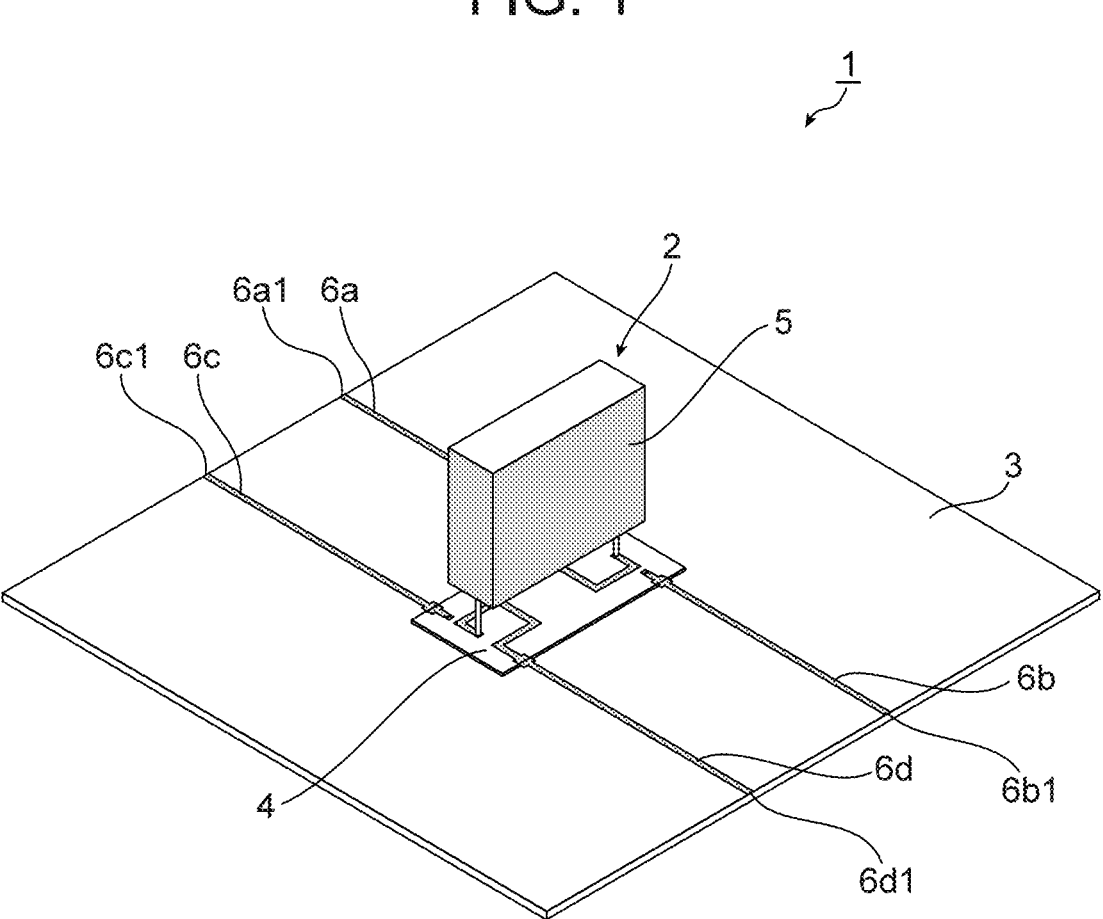
FIG. 1 is a perspective view showing a noise filter circuit according to Embodiment 1.
Figure 2:
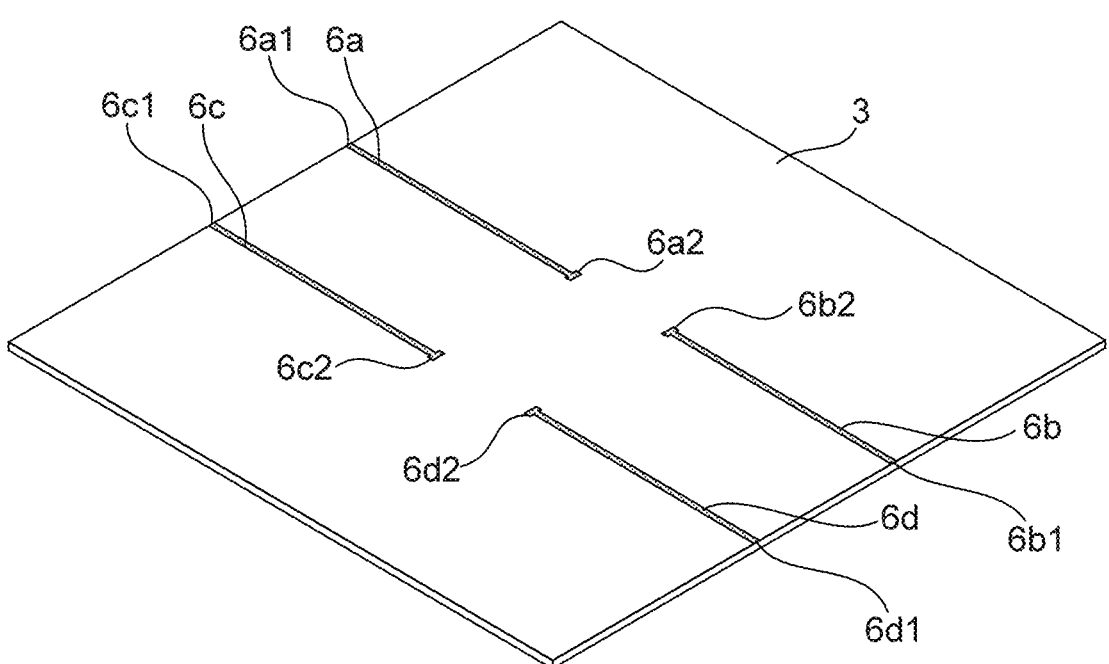
FIG. 2 is a perspective view showing a front surface of a dielectric substrate on which a coupling loop part is mounted.

FIG. 1 is a perspective view showing a noise filter circuit 1 according to Embodiment 1. FIG. 2 is a perspective view showing a front surface of a dielectric substrate 3 on which a coupling loop part 2 is mounted. The noise filter circuit 1 suppresses a noise in a so-called normal mode which is inputted, with an opposite phase, between a positive electrode side input line 6a and a negative electrode side input line 6c, to prevent the noise from being outputted to a positive electrode side output line 6b and a negative electrode side output line 6d. As shown in FIG. 1, the noise filter circuit 1 includes the coupling loop part 2 and the dielectric substrate 3, and the coupling loop part 2 is configured so as to include a substrate part 4 and a capacitor 5.

The dielectric substrate 3 is a first dielectric substrate having a mounting surface (referred to as front surface hereinafter) on which the coupling loop part 2 is mounted, and the positive electrode side input line 6a, the positive electrode side output line 6b, the negative electrode side input line 6c, and the negative electrode side output line 6d are formed on the front surface. Further, a not-illustrated ground conductor is formed on a surface (referred to as rear surface hereinafter) opposite to the mounting surface of the dielectric substrate 3.

The positive electrode side input line 6a is a first positive electrode side input line which is configured by a conductor pattern formed on the front surface of the dielectric substrate 3. One end of the positive electrode side input line 6a is connected to a positive electrode side input terminal 6a1, and another end thereof is a positive electrode side input connecting end part 6a2, as shown in FIG. 2. The positive electrode side output line 6b is a first positive electrode side output line which is configured by a conductor pattern formed on the front surface of the dielectric substrate 3. One end of the positive electrode side output line 6b is connected to a positive electrode side output terminal 6b1, and another end thereof is a positive electrode side output connecting end part 6b2, as shown in FIG. 2.

The negative electrode side input line 6c is a first negative electrode side input line which is configured by a conductor pattern formed on the front surface of the dielectric substrate 3. One end of the negative electrode side input line 6c is connected to a negative electrode side input terminal 6c1, and another end thereof is a negative electrode side input connecting end part 6c2, as shown in FIG. 2. The negative electrode side output line 6d is a first negative electrode side output line which is configured by a conductor pattern formed on the front surface of the dielectric substrate 3. One end of the negative electrode side output line 6d is connected to a negative electrode side output terminal 6d1, and another end thereof is a negative electrode side output connecting end part 6d2, as shown in FIG. 2.

A region including both a region between the positive electrode side input connecting end part 6a2 and the positive electrode side output connecting end part 6b2 and a region between the negative electrode side input connecting end part 6c2 and the negative electrode side output connecting end part 6d2, on the front surface of the dielectric substrate 3, is a mounting space on which the coupling loop part 2 is mounted. No other conductor patterns are formed on the mounting space, as shown in FIG. 2. No conductor patterns are arranged on the rear surface of the dielectric substrate 3.

Figure 3:
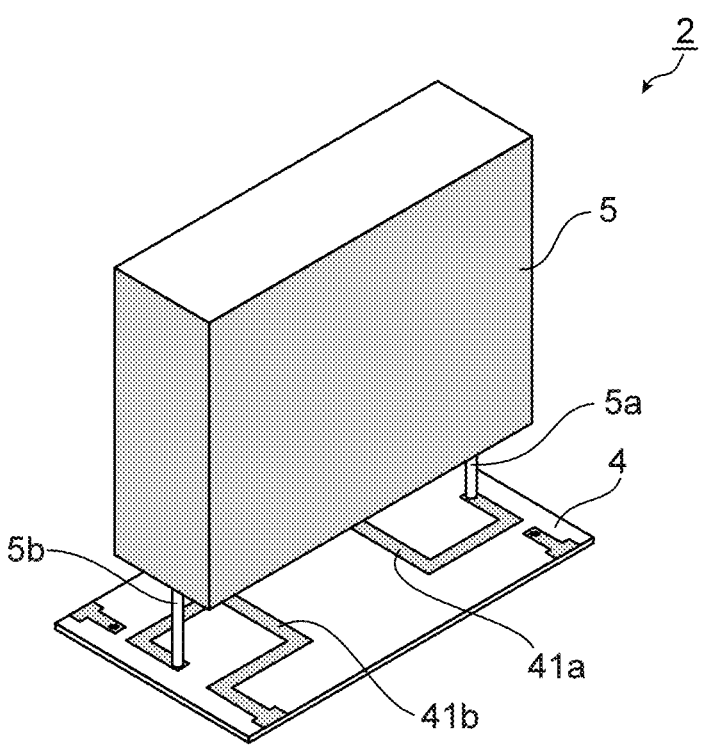
FIG. 3 is a perspective view showing the coupling loop part included in the noise filter circuit according to Embodiment 1.
Figure 4:
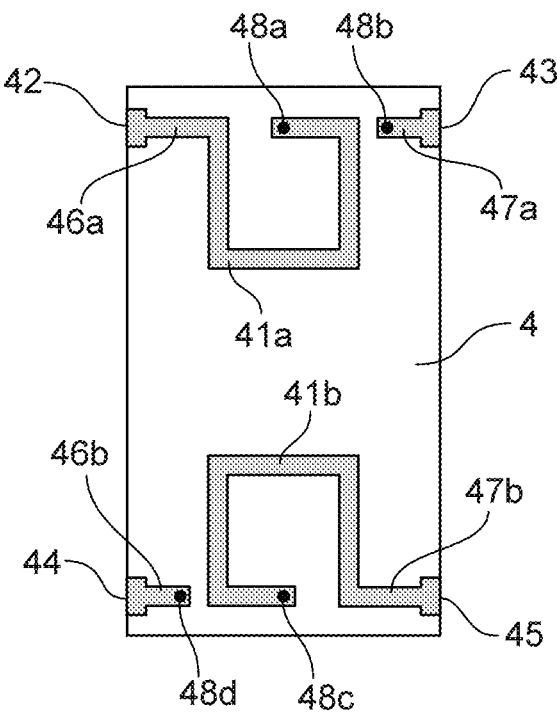
FIG. 4 is a top view showing a front surface of a substrate part included in the coupling loop part.
Figure 5:
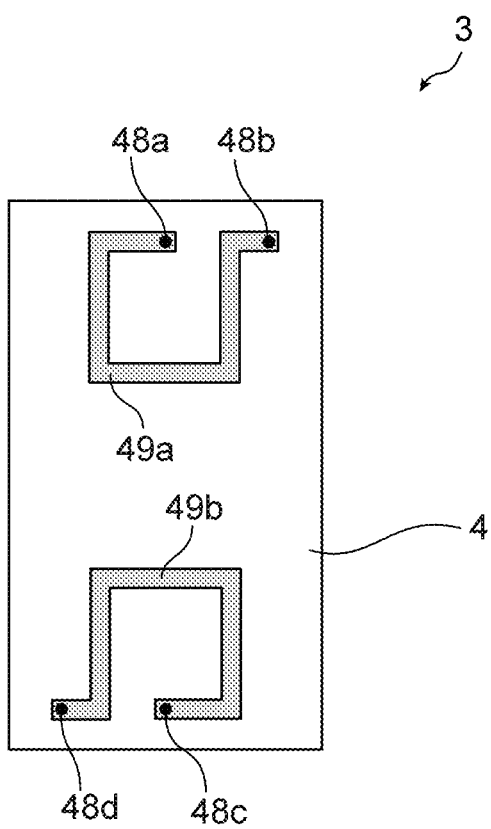
FIG. 5 is a transparent plan view showing a rear surface of the substrate part included in the coupling loop part.

FIG. 3 is a perspective view showing the coupling loop part 2 included in which the noise filter circuit 1. FIG. 4 is a top view showing a front surface of the substrate part 4 included in the coupling loop part 2. FIG. 5 is a transparent plan view showing a rear surface of the substrate part 4 included in the coupling loop part 2, and shows the configuration of the rear surface which is viewed from the front surface when viewed through the substrate part 4. The coupling loop part 2 includes the substrate part 4 and the capacitor 5, as shown in FIG. 3. The substrate part 4 is a second dielectric substrate having a mounting surface on which the capacitor 5 is mounted (referred to as front surface hereinafter). The capacitor 5 configures an ESL cancellation structure.

A positive electrode side input loop line 41a, a negative electrode side output loop line 41b, a positive electrode side input line 46a, a negative electrode side input line 46b, a positive electrode side output line 47a, and a negative electrode side output line 47b are formed on the front surface of the substrate part 4, as shown in FIG. 4. A positive electrode side output loop line 49a and a negative electrode side input loop line 49b are formed on a surface (referred to as rear surface hereinafter) opposite to the mounting surface of the substrate part 4, as shown in FIG. 5.

The positive electrode side input line 46a is a second positive electrode side input line, one end thereof is a positive electrode side input end part 42, and another end thereof is connected to the positive electrode side input loop line 41a. The positive electrode side input loop line 41a has two ends, one end thereof is connected to a through hole 48a, and not connected to the positive electrode side input line 46a. The positive electrode side output line 47a is a second positive electrode side output line, one end thereof is a positive electrode side output end part 43, and another end thereof is connected to a through hole 48b.

The negative electrode side input line 46b is a second negative electrode side input line, one end thereof is a negative electrode side input end part 44, and another end thereof is connected to a through hole 48d. The negative electrode side output line 47b is a second negative electrode side output line, one end thereof is a negative electrode side output end part 45, and another end thereof is connected to an end of the negative electrode side output loop line 41b. One end of the negative electrode side output loop line 41b is connected to a through hole 48c, and not connected to the negative electrode side output line 47b.

One end of the positive electrode side output loop line 49a is connected to the end of the positive electrode side input loop line 41a via the through hole 48a, and another end of the positive electrode side output line 47a is connected to the end of the positive electrode side output loop line 49a via the through hole 48b. One end of the negative electrode side input loop line 49b is connected to another end of the negative electrode side output loop line 41b via the through hole 48c, and another end of the negative electrode side input loop line 49b is connected to the end of the negative electrode side input line 46b via the through hole 48d.

By means of the through holes 48a and 48b, the positive electrode side input line 46a, the positive electrode side input loop line 41a, the positive electrode side output loop line 49a, and the positive electrode side output line 47a are connected in series between the positive electrode side input end part 42 and the positive electrode side output end part 43 in order of the positive electrode side input line 46a, the positive electrode side input loop line 41a, the positive electrode side output loop line 49a, and the positive electrode side output line 47a. Similarly, by means of the through holes 48c and 48d, the negative electrode side input line 46b, the negative electrode side input loop line 49b, the negative electrode side output loop line 41b, and the negative electrode side output line 47b are connected in series between the negative electrode side input end part 44 and the negative electrode side output end part 45 in order of the negative electrode side input line 46b, the negative electrode side input loop line 49b, the negative electrode side output loop line 41b, and the negative electrode side output line 47b.

The capacitor 5 is a capacitive circuit part having a positive electrode terminal 5a which is connected to the positive electrode side input loop line 41a, and a negative electrode terminal 5b which is connected to the negative electrode side output loop line 41b. For example, a film capacitor is used as the capacitor 5. As shown in FIG. 3, the positive electrode terminal 5a of the capacitor 5 is connected to the through hole 48a, and the negative electrode terminal 5b of the capacitor 5 is connected to the through hole 48c. The capacitor 5 has a function of suppressing a noise which flows between the positive electrode side input end part 42 and the positive electrode side output end part 43 in the coupling loop part 2.

The capacitor 5 stops working at a frequency higher than a self-resonant frequency which is determined by both an ESL in a shunt path between the positive electrode terminal 5a and the negative electrode terminal 5b, and the capacitance of the capacitor 5. The ESL thus degrades the filter performance of the capacitor 5. Accordingly, the coupling loop part 2 is designed in such a way that the capacitor 5 has a size and its mounted state which cause the ESL in the above-mentioned shunt path to be canceled.

As shown in FIGS. 4 and 5, in the coupling loop part 2, the positive electrode side input loop line 41*a* and the positive electrode side output loop line 49*a* are arranged in such a way as to face each other along a direction of the thickness of the substrate part 4. In the substrate part 4, the positive electrode side input loop line 41*a* and the positive electrode side output loop line 49*a* function as a coil extending through the substrate part 4. In addition, the negative electrode side output loop line 41*b* and the negative electrode side input loop line 49*b* are also arranged in such a way as to face each other along the direction of the thickness of the substrate part 4. In the substrate part 4, the negative electrode side output loop line 41*b* and the negative electrode side input loop line 49*b* function as a coil extending through the substrate part 4.

As shown in FIG. 4, on the front surface of the substrate part 4, the positive electrode side input loop line 41*a* has a loop shape extending from the end thereof connected to the positive electrode side input line 46*a* to the other end thereof, a part of the loop shape being open. The negative electrode side output loop line 41*b* has a loop shape extending from the end thereof connected to the negative electrode side output line 47*b* to the other end thereof, a part of the loop shape being open. The size of each of the following loop lines: the positive electrode side input loop line 41*a* and the negative electrode side output loop line 41*b* is, for example, a loop diameter or a loop area on the front surface of the substrate part 4.

As shown in FIG. 5, on the rear surface of the substrate part 4, the positive electrode side output loop line 49*a* has a loop shape extending from the end thereof connected to the through hole 48*a* to the other end thereof, a part of the loop shape being open. The negative electrode side input loop line 49*b* has a loop shape extending from the end thereof connected to the through hole 48*c* to the other end thereof, a part of the loop shape being open. The size of each of the following loop lines: the positive electrode side output loop line 49*a* and the negative electrode side input loop line 49*b* is, for example, a loop area on the rear surface of the substrate part 4.

The positive electrode side input loop line 41*a* has the same winding direction as that of the positive electrode side output loop line 49*a*. The negative electrode side output loop line 41*b* has the same winding direction as that of the negative electrode side input loop line 49*b*. Further, a loop of the positive electrode side input loop line 41*a* and a loop of the positive electrode side output loop line 49*a* have the same size and the same relative positional relationship as those of a loop of the negative electrode side output loop line 41*b* and a loop of the negative electrode side input loop line 49*b*. The relative positional relationship is the positional relationship between the loop lines facing each other along the direction of the thickness of the substrate part 4.

Here, the shunt path extending between the through hole 48*a* and the through hole 48*c* in the coupling loop part 2 is expressed by a circuit in which an equivalent inductor having an inductance $L_{ESL}$, an equivalent resistance, and the capacitance of the capacitor 5 are connected in series. In addition, each of the following mutual inductances: a mutual inductance occurring because of the magnetic coupling between the positive electrode side input loop line 41*a* and the positive electrode side output loop line 49*a*, and a mutual inductance occurring because of the magnetic coupling between the negative electrode side output loop line 41*b* and the negative electrode side input loop line 49*b* is denoted by M/2.

The point of the magnetic coupling between the positive electrode side input loop line 41*a* and the positive electrode side output loop line 49*a* can be generally converted into an equivalent circuit in which an equivalent inductor having an inductance of M/2 is added in series to each of the loops formed by the above-mentioned loop lines, and an equivalent inductor having a negative inductance of –M/2 is added in series to the shunt path. Because the ESL occurring in the shunt path becomes ($L_{ESL}$–M) in this equivalent circuit, it is possible to make the ESL occurring in the shunt path be zero by designing the point of the magnetic coupling between the positive electrode side input loop line 41*a* and the positive electrode side output loop line 49*a*, and the point of the magnetic coupling between the negative electrode side output loop line 41*b* and the negative electrode side input loop line 49*b* in such a way that M becomes equal to $L_{ESL}$.

As shown in FIGS. 1, 2, 3, and 4, the coupling loop part 2 is mounted on the dielectric substrate 3 that configures a mount portion in the state where the positive electrode side input connecting end part 6*a*2 that is an end of the positive electrode side input line 6*a*, is connected to the positive electrode side input end part 42 of the positive electrode side input line 46*a*, the positive electrode side output connecting end part 6*b*2 that is an end of the positive electrode side output line 6*b*, is connected to the positive electrode side output end part 43 of the positive electrode side output line 47*a*, the negative electrode side input connecting end part 6*c*2 that is an end of the negative electrode side input line 6*c*, is connected to the negative electrode side input end part 44 of the negative electrode side input line 46*b*, and the negative electrode side output connecting end part 6*d*2 that is an end of the negative electrode side output line 6*d*, is connected to the negative electrode side output end part 45 of the negative electrode side output line 47*b*.

For example, the coupling loop part 2 is arranged in the mounting space of the dielectric substrate 3. In this state, an electrical connection is established between the positive electrode side input connecting end part 6*a*2 and the positive electrode side input end part 42, between the positive electrode side output connecting end part 6*b*2 and the positive electrode side output end part 43, between the negative electrode side input connecting end part 6*c*2 and the negative electrode side input end part 44, and between the negative electrode side output connecting end part 6*d*2 and the negative electrode side output end part 45 using soldering, a bonding wire, or the like. As a result, the coupling loop part 2 is mounted in the mounting space of the dielectric substrate 3.

In the noise filter circuit 1, the coupling loop part 2 is disposed separately from the dielectric substrate 3 which configures the mount portion. In the case of changing the size or the mounted state of the capacitor 5 included in the coupling loop part 2, what is necessary is just to remove the old coupling loop part 2 from the dielectric substrate 3, and newly mount a coupling loop part 2 after change on the dielectric substrate 3. Therefore, the noise filter circuit 1 makes it possible to change the coupling loops without changing the design of the whole circuit.

Although in the above explanation, the loop shapes of the positive electrode side input loop line 41*a*, the positive electrode side output loop line 49*a*, the negative electrode side output loop line 41*b*, and the negative electrode side input loop line 49*b* are squares, it is not limited to this example. For example, the loop shapes may be polygons such as rectangles, circles, ellipses, or the likes as long as the loops have shapes each of which causes a magnetic field in a certain direction to occur inside the loop in response to the current flowing through the loop path.

Further, although in the above explanation, a film capacitor is used as the capacitor 5, it is not limited to this example. For example, the capacitor 5 may be another type of capacitive circuit part such as a ceramic capacitor or an electrolytic capacitor.

As shown in FIG. 2, if another conductor pattern is present, on the dielectric substrate 3, in the mounting space in which the coupling loop part 2 is mounted, the magnetic coupling between the positive electrode side input loop line 41a and the positive electrode side output loop line 49a of the coupling loop part 2, and the magnetic coupling between the negative electrode side output loop line 41b and the negative electrode side input loop line 49b may be weakened, and, as a result, the effect of improvement in the degradation of the filter performance in the ESL cancellation structure may decrease. Therefore, no conductor pattern is disposed in the above-mentioned mounting space on the front surface of the dielectric substrate 3, i.e. a region directly under the coupling loop part 2.

The substrate part 4 which configures the coupling loop part 2 may be a flexible substrate. The magnetic coupling between the positive electrode side input loop line 41a and the positive electrode side output loop line 49a becomes stronger and the mutual inductance also increases as the spacing in the direction of the substrate thickness between the positive electrode side input loop line 41a and the positive electrode side output loop line 49a decreases. Similarly, the magnetic coupling between the negative electrode side output loop line 41b and the negative electrode side input loop line 49b becomes stronger and the mutual inductance also increases as the spacing in the direction of the substrate thickness between the negative electrode side output loop line 41b and the negative electrode side input loop line 49b decreases. Therefore, by using a flexible substrate, e.g. a relatively thin dielectric substrate, such as a flexible printed circuit board, as the substrate part 4, it is possible to reduce the loop diameters of the loop lines to smaller than those in the case of using a relatively thick dielectric substrate.

Although in the above explanation, the case in which the positive electrode side input line 6a, the positive electrode side output line 6b, the negative electrode side input line 6c, the negative electrode side output line 6d, the positive electrode side input line 46a, the negative electrode side input line 46b, the positive electrode side output line 47a, the negative electrode side output line 47b, the positive electrode side input loop line 41a, the negative electrode side output loop line 41b, the positive electrode side output loop line 49a, and the negative electrode side input loop line 49b are conductor patterns formed on the surface of the dielectric substrate is shown, it is not limited to this example. These lines should just be conductive materials, and, for example, bus bars which are thick conductors may be used. By using bus bars as the lines, it is possible to pass a larger current through each of the lines.

Next, variants of the coupling loop part 2 will be explained.

Figure 6:
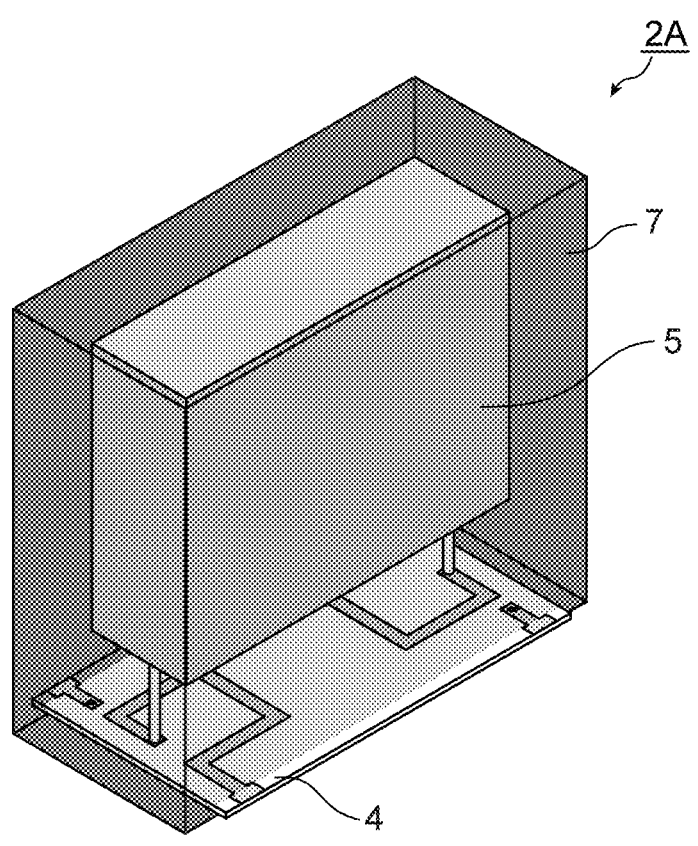
FIG. 6 is a perspective view showing a variant (1) of the coupling loop part.
Figure 7:
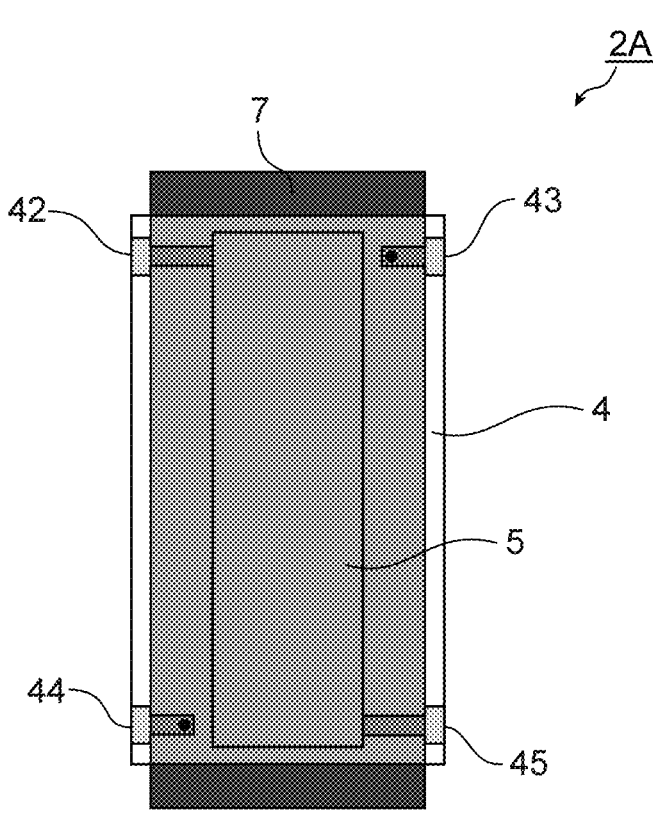
FIG. 7 is a top view showing the variant (1) of the coupling loop part.

FIG. 6 is a perspective view showing a coupling loop part 2A which is a variant (1) of the coupling loop part 2. FIG. 7 is a top view showing the coupling loop part 2A. In FIG. 6, the coupling loop part 2A has a capacitor 5 which is mounted on a substrate part 4, like the coupling loop part 2.

In the coupling loop part 2A, a front surface of the substrate part 4 is molded with a resin 7.

In FIG. 7, the molded part of the coupling loop part 2A is formed in such a way that a positive electrode side input end part 42, a positive electrode side output end part 43, a negative electrode side input end part 44, and a negative electrode side output end part 45 are outside the resin 7. Because the front surface of the substrate part 4 is molded with the resin 7, the coupling loop part 2A has endurance and robustness against shocks from the outside, and the electric insulation improves inside and outside the resin 7.

A magnetic material may be mixed into the resin 7. As a result of mixing a magnetic material into the resin 7 in the coupling loop part 2A, the magnetic coupling between the positive electrode side input loop line 41a and the positive electrode side output loop line 49a becomes strong, the magnetic coupling between the negative electrode side output loop line 41b and the negative electrode side input loop line 49b also becomes strong, and the mutual inductances also increase. As a result, it is possible to make the loop diameters of the loop lines smaller than those in the case where no magnetic material is mixed into the resin 7.

Figure 8:
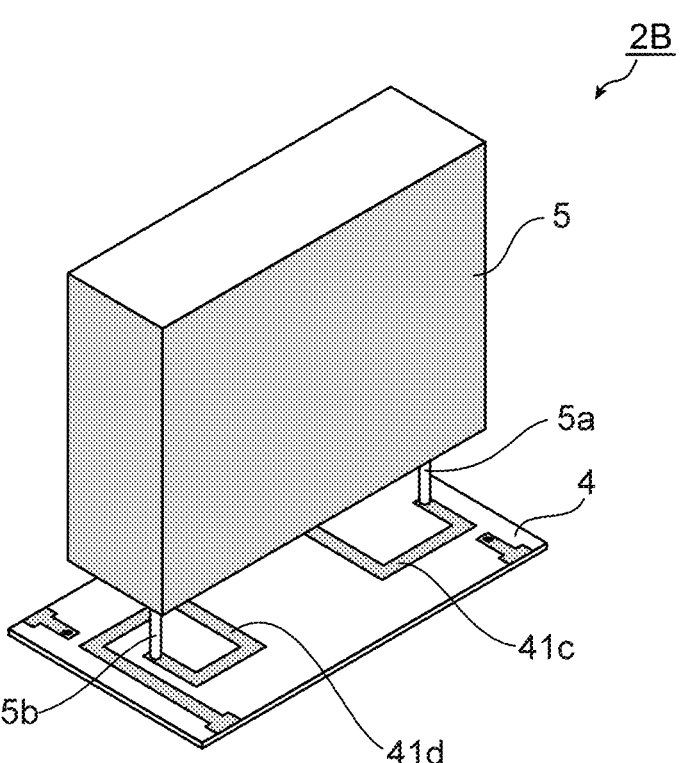
FIG. 8 is a perspective view showing a variant (2) of the coupling loop part.
Figure 9:
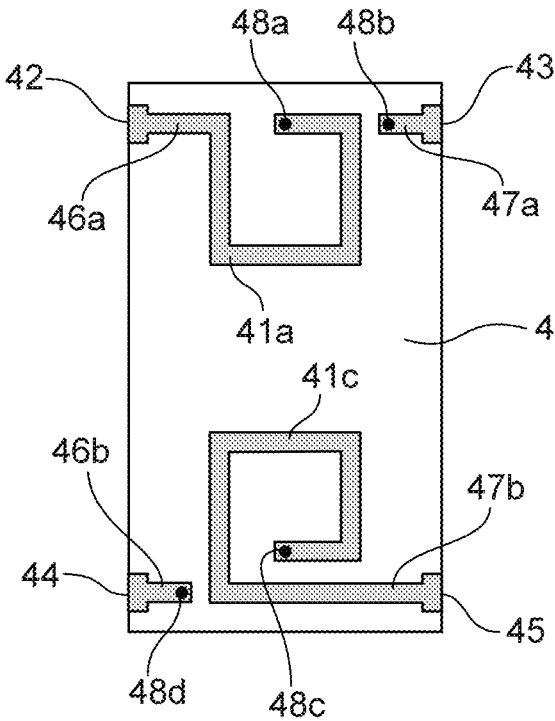
FIG. 9 is a top view showing a front surface of a substrate part included in the variant (2) of the coupling loop part.
Figure 10:
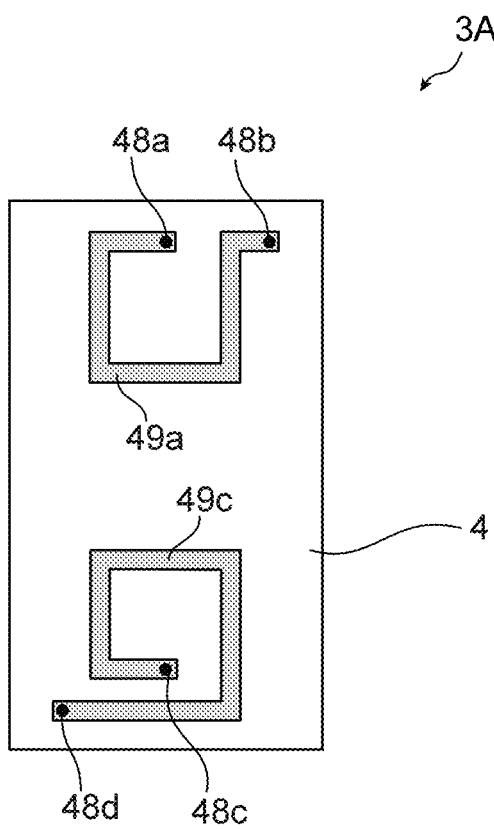
FIG. 10 is a transparent plan view showing a rear surface of the substrate part included in the variant (2) of the coupling loop part.

FIG. 8 is a perspective view showing a coupling loop part 2B which is a variant (2) of the coupling loop part 2. FIG. 9 is a top view showing a front surface of a substrate part 4 included in the coupling loop part 2B. FIG. 10 is a transparent plan view showing a rear surface of the substrate part 4 included in the coupling loop part 2B, and shows the configuration of the rear surface which is viewed from the front surface when viewed through the substrate part 4. As shown in FIG. 8, the coupling loop part 2B is configured in such a way that a capacitor 5 is mounted on the substrate part 4, like the coupling loop part 2.

As shown in FIG. 9, a positive electrode side input loop line 41a, a negative electrode side output loop line 41c, a positive electrode side input line 46a, a negative electrode side input line 46b, a positive electrode side output line 47a, and a negative electrode side output line 47b are formed on the front surface of the substrate part 4. As shown in FIG. 10, a positive electrode side output loop line 49a and a negative electrode side input loop line 49c are formed on the rear surface of the substrate part 4.

The positive electrode side input loop line 41a has the same winding direction as that of the positive electrode side output loop line 49a. On the other hand, the negative electrode side output loop line 41c has the same winding direction as that of the negative electrode side input loop line 49c. In addition, the loop of the positive electrode side input loop line 41a and the loop of the positive electrode side output loop line 49a has the same size and the same relative positional relationship as those of the loop of the negative electrode side output loop line 41c and the loop of the negative electrode side input loop line 49c.

As shown in FIGS. 9 and 10, in the coupling loop part 2B, the winding direction of the positive electrode side input loop line 41a and the winding direction of the negative electrode side input loop line 49c are opposite to each other.

The positive electrode side input line 46a has an end which is a positive electrode side input end part 42, and another end which is connected to the positive electrode side input loop line 41a. A through hole 48a is connected to one of both ends of the positive electrode side input loop line 41a, the one being not connected to the positive electrode side input line 46a. The positive electrode side output line 47a has an end which is a positive electrode side output end part 43, and another end which is connected to a through hole 48b.

One end of the negative electrode side input line 46*b* is a negative electrode side input end part 44, and another end is connected to a through hole 48*d*. The negative electrode side output line 47*b* is a second negative electrode side output line, one end thereof is a negative electrode side output end part 45, and another end thereof is connected to the end of the negative electrode side output loop line 41*c*. The negative electrode side output loop line 41*c* has two ends, one end is connected to a through hole 48*c*, and not connected to the negative electrode side output line 47*b*.

One end of the positive electrode side output loop line 49*a* is connected to the end of the positive electrode side input loop line 41*a* via the through hole 48*a*, and another end of the positive electrode side output loop line 49*a* is connected to the end of the positive electrode side output line 47*a* via the through hole 48*b*. One end of the negative electrode side input loop line 49*b* via the through hole 48*c* is connected to the end of the negative electrode side output loop line 41*c*, and another end of the negative electrode side input loop line 49*c* is connected to the end of the negative electrode side input line 46*b* via the through hole 48*d*.

By means of the through holes 48*a* and 48*b*, the positive electrode side input line 46*a*, the positive electrode side input loop line 41*a*, the positive electrode side output loop line 49*a*, and the positive electrode side output line 47*a* are connected in series between the positive electrode side input end part 42 and the positive electrode side output end part 43 in order of the positive electrode side input line 46*a*, the positive electrode side input loop line 41*a*, the positive electrode side output loop line 49*a*, and the positive electrode side output line 47*a*. Similarly, by means of the through holes 48*c* and 48*d*, the negative electrode side input line 46*b*, the negative electrode side input loop line 49*c*, the negative electrode side output loop line 41*c*, and the negative electrode side output line 47*b* are connected in series between the negative electrode side input end part 44 and the negative electrode side output end part 45 in order of the negative electrode side input line 46*b*, the negative electrode side input loop line 49*c*, the negative electrode side output loop line 41*c*, and the negative electrode side output line 47*b*.

The capacitor 5 which is a capacitive circuit part has a positive electrode terminal 5*a* which is connected to the positive electrode side input loop line 41*a*, and a negative electrode terminal 5*b* which is connected to the negative electrode side output loop line 41*c*. For example, a film capacitor is used as the capacitor 5. As shown in FIG. 8, the positive electrode terminal 5*a* of the capacitor 5 is connected to the through hole 48*a*, and the negative electrode terminal 5*b* of the capacitor 5 is connected to the through hole 48*c*. The capacitor 5 has a function of suppressing a noise flowing between the positive electrode side input end part 42 and the positive electrode side output end part 43 in the coupling loop part 2B.

The capacitor 5 stops working at a frequency higher than the self-resonant frequency which is determined by both the ESL in a shunt path extending between the positive electrode terminal 5*a* and the negative electrode terminal 5*b*, and the capacitance of the capacitor 5. The ESL thus degrades the filter performance of the capacitor 5. Accordingly, the coupling loop part 2B is designed in such a way that the capacitor 5 has a size and its mounted state which cause the ESL in the above-mentioned shunt path to be canceled.

As shown in FIGS. 9 and 10, in the coupling loop part 2B, the positive electrode side input loop line 41*a* and the positive electrode side output loop line 49*a* are arranged in such a way as to face each other along a direction of the thickness of the substrate part 4. In the substrate part 4, the positive electrode side input loop line 41*a* and the positive electrode side output loop line 49*a* function as a coil extending through the substrate part 4. The negative electrode side output loop line 41*c* and the negative electrode side input loop line 49*b* are also arranged in such a way as to face each other along the direction of the thickness of the substrate part 4. In the substrate part 4, the negative electrode side output loop line 41*c* and the negative electrode side input loop line 49*c* function as a coil extending through the substrate part 4.

Figure 11:
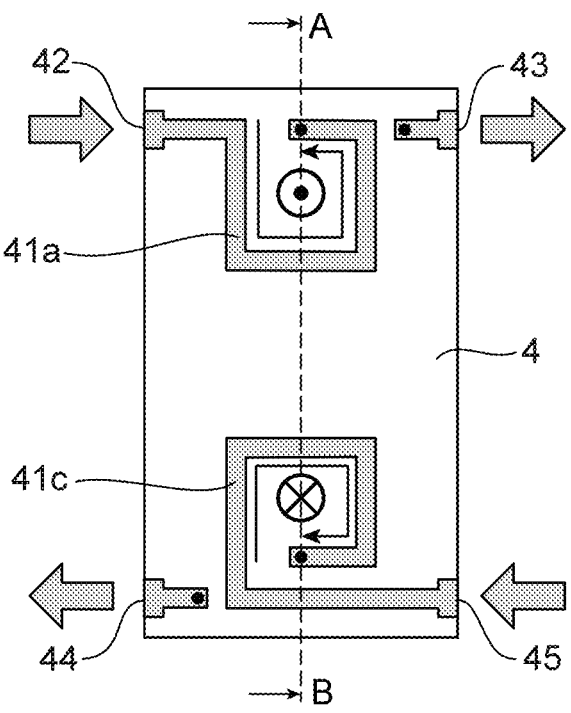
FIG. 11 is a schematic view showing the directions of magnetic fields which occur in the variant (2) of the coupling loop part when normal mode currents are inputted.

FIG. 11 is a schematic view showing the directions of magnetic fields which occur in the coupling loop part 2B when normal mode currents are inputted. In FIG. 11, wide arrows show the directions in which currents flow in the coupling loop part 2B, and a current is inputted to a current path on a positive electrode side in such a way as to flow from the positive electrode side input end part 42 to the positive electrode side output end part 43. Further, a current is inputted to a current path on a negative electrode side in such a way as to flow, in a direction from the negative electrode side output end part 45 to the negative electrode side input end part 44, with a phase opposite to that of the current on the positive electrode side.

By inputting the currents to the coupling loop part 2B in the above-mentioned way, the direction of a magnetic field occurring in each loop is as follows: a magnetic field occurs, in a direction from the rear side of the page to the front side of the page, between the positive electrode side input loop line 41*a* and the positive electrode side output loop line 49*a* in the path on the positive electrode side, as shown in FIG. 11. In contrast, a magnetic field occurs, in a direction from the front side of the page to the rear side of the page, between the negative electrode side output loop line 41*c* and the negative electrode side input loop line 49*c* in the path on the positive electrode side.

Figure 12:
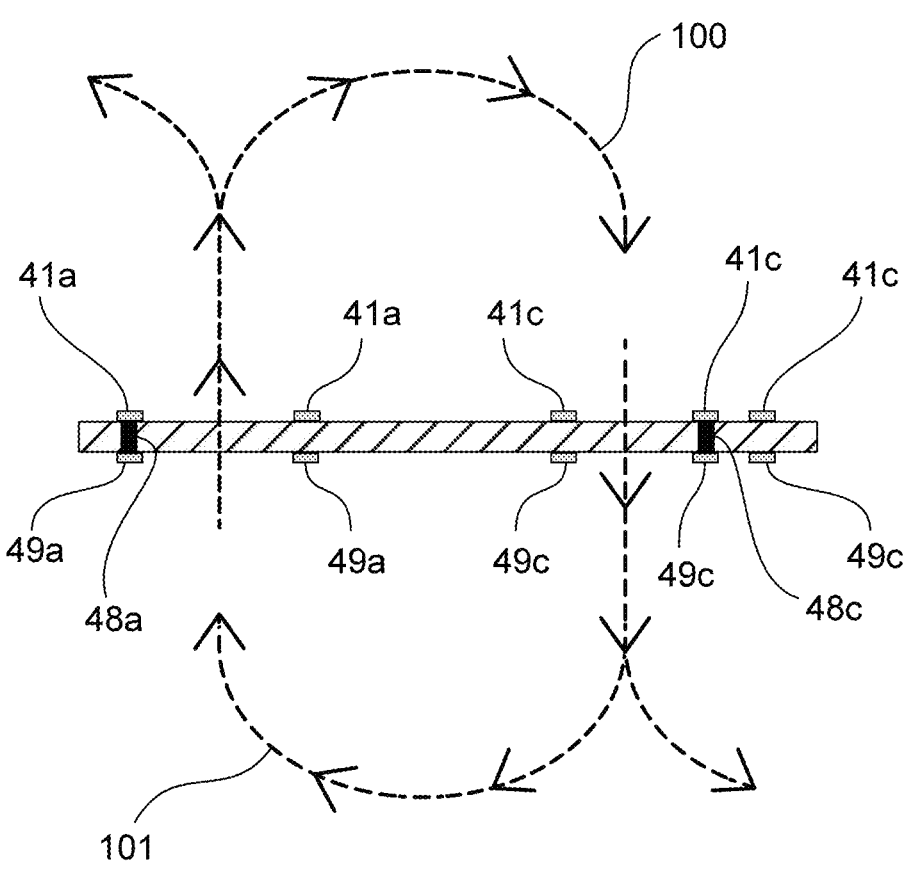
FIG. 12 is a cross-sectional view on arrow showing a cross section of the variant (2) of the coupling loop part, taken along the A-B line of FIG. 11.

FIG. 12 is a cross-sectional view on arrow showing a cross section of the coupling loop part 2B, taken along the A-B line of FIG. 11. In FIG. 12, a dashed arrow 100 shows the direction of the magnetic field shown in FIG. 11 and occurring between the positive electrode side input loop line 41*a* and the positive electrode side output loop line 49*a*. Further, an arrow of an alternate long and short dash line 101 shows the direction of the magnetic field shown in FIG. 11 and occurring between the negative electrode side output loop line 41*c* and the negative electrode side input loop line 49*c*.

As shown in FIG. 12, because the magnetic field occurring between the positive electrode side input loop line 41*a* and the positive electrode side output loop line 49*a* and the magnetic field occurring between the negative electrode side output loop line 41*c* and the negative electrode side input loop line 49*c* have the same direction and strengthen each other, the mutual inductance occurring in each of the coupling loops increases. Therefore, it becomes possible to make the loop diameters smaller than those of coupling loops in which no increase in the mutual inductance occurs.

When currents in a normal mode are inputted to the coupling loop part 2, a magnetic field in a direction from the rear side of the page to the front side of the page occurs between the positive electrode side input loop line 41*a* and the positive electrode side output loop line 49*a* in the path on the positive electrode side, like that shown in FIG. 11. A magnetic field in a direction from the rear side of the page to the front side of the page also occurs between the negative electrode side input loop line 49*b* and the negative electrode side output loop line 41*b* in the path on the negative electrode side. Therefore, considering the same cross section as that shown in FIG. 12, in the coupling loop part 2, the magnetic field occurring between the positive electrode side input loop line 41*a* and the positive electrode side output loop line 49*a* and the magnetic field occurring between the negative electrode side input loop line 49*b* and the negative electrode side output loop line 41*b* cancel each other out. Therefore, the coupling loop part 2 does not provide an advantage of increasing the mutual inductances occurring in the coupling loops, unlike the coupling loop part 2B.

As mentioned above, in the noise filter circuit 1 according to Embodiment 1, the coupling loop part 2 having the capacitor 5 which is connected to both the positive electrode side input loop line 41*a* and the negative electrode side output loop line 41*b* is mounted on the dielectric substrate 3 in the state where the positive electrode side input line 6*a* and the positive electrode side input end part 42 are connected, the positive electrode side output line 6*b* and the positive electrode side output end part 43 are connected, the negative electrode side input line 6*c* and the negative electrode side input end part 44 are connected, and the negative electrode side output line 6*d* and the negative electrode side output end part 45 are connected. By changing the coupling loop part 2 which is separate from the dielectric substrate 3, it is possible to change the coupling loops in the noise filter circuit 1 without changing the design of the whole circuit.

The noise filter circuit 1 according to Embodiment 1 includes the substrate part 4 having the mounting surface on which the coupling loop part 2 is mounted, and the positive electrode side input line 6*a*, the negative electrode side input line 6*c*, the positive electrode side output line 6*b*, and the negative electrode side output line 6*d* are disposed on the mounting surface of the dielectric substrate 3. As a result, the coupling loop part 2 which is separate from the dielectric substrate 3 can be provided.

In the noise filter circuit 1 according to Embodiment 1, the coupling loop part 2 has the substrate part 4. The positive electrode side input line 46*a*, the negative electrode side input line 46*b*, the positive electrode side output line 47*a*, the negative electrode side output line 47*b*, the positive electrode side input loop line 41*a*, and the negative electrode side output loop line 41*b* are disposed on the front surface of the substrate part 4. The positive electrode side output loop line 49*a* is disposed on the rear surface of the substrate part 4, and has an end which is connected to the positive electrode side input loop line 41*a* through the substrate part 4, and another end which is connected to the positive electrode side output line 47*a* through the substrate part 4. The negative electrode side input loop line 49*b* is disposed on the rear surface of the substrate part 4, and has an end which is connected to the negative electrode side output loop line 41*b* through the substrate part 4, and another end which is connected to the negative electrode side input line 46*b* through the substrate part 4. The capacitor 5 is disposed on the front surface of the substrate part 4, and the positive electrode terminal 5*a* is connected to the positive electrode side input loop line 41*a* and the negative electrode terminal 5*b* is connected to the negative electrode side output loop line 41*b*. As a result, the coupling loop part 2 which is separate from the dielectric substrate 3 can be provided.

In the noise filter circuit 1 according to Embodiment 1, the substrate part 4 is a flexible substrate. By using a thin flexible substrate as the substrate part 4, it is possible to make the loop diameter of each loop line smaller than that in a case where a relatively thick dielectric substrate is used.

In the noise filter circuit 1 according to Embodiment 1, in the coupling loop part 2A, the front surface of the substrate part 4 is molded with the resin 7. By molding the front surface of the substrate part 4 with the resin 7, the coupling loop part 2A has endurance and robustness against shocks from the outside, and the electric insulation improves inside and outside the resin 7.

In the noise filter circuit 1 according to Embodiment 1, a magnetic material is mixed into the resin 7. By mixing a magnetic material into the resin 7, the loop diameter of each loop line in the coupling loop part 2A can be reduced.

In the noise filter circuit 1 according to Embodiment 1, the positive electrode side input line 6*a*, the positive electrode side output line 6*b*, the negative electrode side input line 6*c*, the negative electrode side output line 6*d*, the positive electrode side input line 46*a*, the negative electrode side input line 46*b*, the positive electrode side output line 47*a*, the negative electrode side output line 47*b*, the positive electrode side input loop line 41*a*, the negative electrode side output loop line 41*b*, the positive electrode side output loop line 49*a*, and the negative electrode side input loop line 49*b* are configured by bus bars. By using bus bars which are thick conductors, larger currents can be passed through the lines in the coupling loop part 2.

In the noise filter circuit 1 according to Embodiment 1, the coupling loop part 2B is the one in which the winding direction of the positive electrode side input loop line 41*a* and the winding direction of the negative electrode side input loop line 49*c* are opposite to each other. With this configuration, in the coupling loop part 2B, the magnetic field occurring between the positive electrode side input loop line 41*a* and the positive electrode side output loop line 49*a* and the magnetic field occurring between the negative electrode side output loop line 41*c* and the negative electrode side input loop line 49*c* strengthen each other, and the mutual inductances occurring in the coupling loops increase. Therefore, the coupling loop part 2B makes it possible to make the loop diameters smaller than those of coupling loops in which no increase in the mutual inductance occurs.

It is to be understood that changes can be made in an arbitrary component of the embodiment, or an arbitrary component of the embodiment can be omitted.

INDUSTRIAL APPLICABILITY

The noise filter circuit according to the present disclosure can be used to, for example, wireless communication equipment.

REFERENCE SIGNS LIST

1: Noise filter circuit, 2, 2A, and 2B: Coupling loop part, 3: Dielectric substrate, 4: Substrate part, 5: Capacitor, 5*a*: Positive electrode terminal, 5*b*: Negative electrode terminal, 6*a*: Positive electrode side input line, 6*a*1: Positive electrode side input terminal, 6*a*2: Positive electrode side input connecting end part, 6*b*: Positive electrode side output line, 6*b*1: Positive electrode side output terminal, 6*b*2: Positive electrode side output connecting end part, 6*c*: Negative electrode side input line, 6*c*1: Negative electrode side input terminal, 6*c*2: Negative electrode side input connecting end part, 6*d*: Negative electrode side output line, 6*d*1: Negative electrode side output terminal, 6*d*2: Negative electrode side output connecting end part, 41*a*: Positive electrode side input loop line, 41*b* and 41*c*: Negative electrode side output loop line, 42: Positive electrode side input end part, 43: Positive electrode side output end part, 44: Negative electrode side input end part, 45: Negative electrode side output end part, 46a: Positive electrode side input line, 46b: Negative electrode side input line, 47a: Positive electrode side output line, 47b: Negative electrode side output line, 48a, 48b, 48c, and 48d: Through hole, 49a: Positive electrode side output loop line, 49b and 49c: Negative electrode side input loop line

The invention claimed is:

1. A noise filter circuit comprising:

a mount portion having: a first positive electrode side input line, one end thereof being connected to a positive electrode side input terminal; a first negative electrode side input line, one end thereof being connected to a negative electrode side input terminal; a first positive electrode side output line, one end thereof being connected to a positive electrode side output terminal; and a first negative electrode side output line, one end thereof being connected to a negative electrode side output terminal; and a coupling loop part having a second positive electrode side input line, a second negative electrode side input line, a second positive electrode side output line, a second negative electrode side output line, a positive electrode side input loop line, a positive electrode side output loop line, a negative electrode side input loop line, a negative electrode side output loop line, and a capacitive circuit part, wherein the second positive electrode side input line, the positive electrode side input loop line, the positive electrode side output loop line, and the second positive electrode side output line are connected in series between a positive electrode side input end part and a positive electrode side output end part in order of the second positive electrode side input line, the positive electrode side input loop line, the positive electrode side output loop line, and the second positive electrode side output line, the second negative electrode side input line, the negative electrode side input loop line, the negative electrode side output loop line, and the second negative electrode side output line are connected in series between a negative electrode side input end part and a negative electrode side output end part in order of the second negative electrode side input line, the negative electrode side input loop line, the negative electrode side output loop line, and the second negative electrode side output line, a positive electrode terminal of the capacitive circuit part is connected to the positive electrode side input loop line, and a negative electrode terminal of the capacitive circuit part is connected to the negative electrode side output loop line, the positive electrode side input loop line has a winding direction identical to that of the positive electrode side output loop line, the negative electrode side input loop line has a winding direction identical to that of the negative electrode side output loop line, a loop of the positive electrode side input loop line and a loop of the positive electrode side output loop line are identical in size to a loop of the negative electrode side input loop line and a loop of the negative electrode side output loop line, and a relative positional relationship between the positive electrode side input loop line and the positive electrode side output loop line is identical to a relative positional relationship between the negative electrode side input loop line and the negative electrode side output loop line, the mount portion includes a first dielectric substrate having a mounting surface on which the coupling loop part is mounted, the first positive electrode side input line, the first negative electrode side input line, the first positive electrode side output line, and the first negative electrode side output line are disposed on the mounting surface of the first dielectric substrate, the coupling loop part is mounted in the mount portion in a state where another end of the first positive electrode side input line is connected to the positive electrode side input end, another end of the first positive electrode side output line is connected to the positive electrode side output end, another end of the first negative electrode side input line is connected to the negative electrode side input end, and another end of the first negative electrode side output line is connected to the negative electrode side output end, the coupling loop part has a second dielectric substrate, the second positive electrode side input line, the second negative electrode side input line, the second positive electrode side output line, the second negative electrode side output line, the positive electrode side input loop line, and the negative electrode side output loop line are disposed on a front surface of the second dielectric substrate, the positive electrode side output loop line is disposed on a rear surface of the second dielectric substrate, one end thereof is connected to the positive electrode side input loop line through the second dielectric substrate, and another end thereof is connected to the second positive electrode side output line through the second dielectric substrate, the negative electrode side input loop line is disposed on the rear surface of the second dielectric substrate, one end thereof is connected to the negative electrode side output loop line through the second dielectric substrate, and another end thereof is connected to the second negative electrode side input line through the second dielectric substrate, and the capacitive circuit part is disposed on the front surface of the second dielectric substrate, the positive electrode terminal is connected to the positive electrode side input loop line, and the negative electrode terminal is connected to the negative electrode side output loop line.

2. The noise filter circuit according to claim 1, wherein the second dielectric substrate is a flexible substrate.

3. The noise filter circuit according to claim 1, wherein in the coupling loop part, the front surface of the second dielectric substrate is molded with a resin.

4. The noise filter circuit according to claim 3, wherein a magnetic material is mixed into the resin.

5. The noise filter circuit according to claim 1, wherein in the coupling loop part, the positive electrode side input loop line and the negative electrode side input loop line have opposite winding directions.

6. A noise filter circuit comprising:

a mount portion having: a first positive electrode side input line, one end thereof being connected to a positive electrode side input terminal; a first negative electrode side input line, one end thereof being connected to a negative electrode side input terminal; a first positive electrode side output line, one end thereof being connected to a positive electrode side output terminal; and a first negative electrode side output line, one end thereof being connected to a negative electrode side output terminal;

a coupling loop part having a second positive electrode side input line, a second negative electrode side input line, a second positive electrode side output line, a second negative electrode side output line, a positive electrode side input loop line, a positive electrode side output loop line, a negative electrode side input loop line, a negative electrode side output loop line, and a capacitive circuit part, wherein the second positive electrode side input line, the positive electrode side input loop line, the positive electrode side output loop line, and the second positive electrode side output line are connected in series between a positive electrode side input end part and a positive electrode side output end part in order of the second positive electrode side input line, the positive electrode side input loop line, the positive electrode side output loop line, and the second positive electrode side output line, the second negative electrode side input line, the negative electrode side input loop line, the negative electrode side output loop line, and the second negative electrode side output line are connected in series between a negative electrode side input end part and a negative electrode side output end part in order of the second negative electrode side input line, the negative electrode side input loop line, the negative electrode side output loop line, and the second negative electrode side output line, a positive electrode terminal of the capacitive circuit part is connected to the positive electrode side input loop line, and a negative electrode terminal of the capacitive circuit part is connected to the negative electrode side output loop line, the positive electrode side input loop line has a winding direction identical to that of the positive electrode side output loop line, the negative electrode side input loop line has a winding direction identical to that of the negative electrode side output loop line, a loop of the positive electrode side input loop line and a loop of the positive electrode side output loop line are identical in size to a loop of the negative electrode side input loop line and a loop of the negative electrode side output loop line, and a relative positional relationship between the positive electrode side input loop line and the positive electrode side output loop line is identical to a relative positional relationship between the negative electrode side input loop line and the negative electrode side output loop line, the coupling loop part is mounted in the mount portion in a state where another end of the first positive electrode side input line is connected to the positive electrode side input end, another end of the first positive electrode side output line is connected to the positive electrode side output end, another end of the first negative electrode side input line is connected to the negative electrode side input end, and another end of the first negative electrode side output line is connected to the negative electrode side output end, and the first positive electrode side input line, the first negative electrode side input line, the first positive electrode side output line, the first negative electrode side output line, the second positive electrode side input line, the second negative electrode side input line, the second positive electrode side output line, the second negative electrode side output line, the positive electrode side input loop line, the negative electrode side output loop line, the positive electrode side output loop line, and the negative electrode side input loop line are configured by bus bars.

7. The noise filter circuit according to claim 6, wherein in the coupling loop part, the positive electrode side input loop line and the negative electrode side input loop line have opposite winding directions.

* * * * *